United States Patent [19]

Gilton

[11] Patent Number: 5,129,991
[45] Date of Patent: Jul. 14, 1992

[54] PHOTOELECTRON-INDUCED SELECTIVE ETCH PROCESS

[75] Inventor: Terry L. Gilton, Boise, Id.

[73] Assignee: Micron Technology, Inc., Boise, Id.

[21] Appl. No.: 694,011

[22] Filed: Apr. 30, 1991

[51] Int. Cl.$^5$ .............. H01L 21/306; B44C 1/22; C23F 1/02; B29C 37/00
[52] U.S. Cl. .............. 156/635; 156/643; 156/646; 156/656; 156/657; 156/659.1; 156/662; 156/668; 219/121.69; 219/121.84
[58] Field of Search .............. 156/635, 643, 646, 655, 156/656, 657, 659.1, 662, 668, 345; 219/121.68, 121.69, 121.84, 121.85; 427/53.1; 204/192.32, 192.36, 192.37

[56] References Cited

U.S. PATENT DOCUMENTS

| | | | |
|---|---|---|---|
| 4,490,210 | 12/1984 | Chen et al. | 156/643 |
| 4,615,765 | 10/1986 | Levinson et al. | 156/635 X |
| 4,643,799 | 2/1987 | Tsujii et al. | 156/635 |
| 4,678,536 | 7/1987 | Murayama et al. | 156/635 |

OTHER PUBLICATIONS

Gilton, et al., "Intense Surface Photoemission: Space Charge Effects and Self-Acceleration", J. Appl. Phys. 68(9), 1 Nov. 1990, pp. 4802–4810.
Gluck, N. S. et al., "Mechanisms of Laser Interaction With Metal Carbonyls Adsorbed on Si(111)7X7: Thermal vs Photoelectric Effects," J. Chem. Phys. 86(9) (May 1, 1987).
Marsh, Eugene P. et al., "Electron-Transfer-Mediated and Direct Surface Photochemistry CH3 on Ni(111)", Physical Review Letters vol. 61, No. 23 (Dec. 5, 1988).
Gilton, Terry L. et al., "Electron Transmission Through Layers of H2O and Xe in the Ultrahigh Vacuum Photoreduction of CH3Cl on Ni(111)", J. Chem. Phys. 91(3) (Aug. 1, 1989).
Marsh, E. P. et al., "Peturbations, Inhibition, and Promotion of Ultraviolet Surface Photochemistry: CH3Br on Br/Ni(111)", J. Chem. Phys. 92(3) (Feb. 1, 1990).
Marsh, E. P. et al., "Ultraviolet Surface Photochemistry and Charge Transfer", Springer Series in Surface Science, vol. 13 Desportion Induced by Electronic Transitions, DIET III (1988).
Kawasaki, M. "Laser Photoassociation methyl chloride on Low-Temperature Silicon Substrates", J. Appl. Phys. 65(2) (Jan. 15, 1980).
Ehrlich, D. J. et al., "Laser Microphotochemistry for Use in Solid-State Electronics", IEEE Journ. of Quantum Electronics, vol. Qe-16, No. 11 (Nov. 1980).
Ehrlich, D. L. et al., "Laser Photoreactions of Volatile Surface-Adsorbed Molecules", Surface Studies With Lasers. Procedings of the International Conference, Springer-Verlag, Berlin, W. Germany.
Wen, C. R. et al., "Time-Dependent Photolysis of Adsorbed Molecules Using Synchroton Radiation: CH3F/Si(111) 7×"), Surface Science (1989) 218 (2-3) L483-L489.
Gilton, Terry L. "The Role of Substrate Photoelectrons in the Ultraviolet Photochemistry of Physisorbed Methyl Halides", Dissertation (Feb. 1990).

*Primary Examiner*—William A. Powell
*Attorney, Agent, or Firm*—Limbach & Limbach

[57] ABSTRACT

The relative photoemission threshold properties of conductive materials are used as a basis for selectively etching conductive materials in the presence of other conductive materials. An irradiation beam of pre-selected wavelength is used to generate photoemitted electrons locally which in turn create reactive etch fragments in localized regions adjacent to the electron source. These localized fragments react with the material to be etched to form volatile reaction products which are removed from the chamber in which these reactions take place. Various configurations for the treatment of conductive materials are described. In one embodiment, the irradiation beam is impinged upon the substrate at an incident angle to create non-orthogonal surfaces.

13 Claims, 2 Drawing Sheets

PHOTOELECTRON-INDUCED SELECTIVE ETCH PROCESS

TECHNICAL FIELD

The present invention relates generally to solid-state materials processing and in particular, this invention relates to the use of photons to generate electrons from conductive materials which combine with etch gas molecules to form reactive fragments capable of performing the desired etching. Etch selectivity is achieved by tuning the photon wavelength to exceed the photoemission threshold of the conductive material to be etched while not exceeding the photoemission threshold of adjacent material which is not to be etched.

BACKGROUND OF THE INVENTION

In current microelectronics fabrication technology, a variety of techniques are employed to create multilayered structures having specific electron-transport configurations in both the horizontal direction and the vertical direction. The object of these fabrication techniques is the precise formation of electronically active circuits on the molecular level. Some processing techniques commonly used to achieve these structures are wet processing and plasma etching. These techniques are utilized to selectively expose and to mask conductive regions so that the multilayered structure can be appropriately built in the vertical direction, with the desired horizontal base region. These types of lithographic processes, however, have process limitations which directly affect the design of the circuitry which can be accomplished, as well as the overall yield of any fabrication processes which use these lithographic techniques. In light of these process limitations, there is ample motivation for the development of processes for selectively exposing and covering regions on the multilayered structure which are more selective and have higher yields than existing lithographic processing techniques.

The present invention provides greater etching specificity than prior lithographic techniques because it involves molecular-level interaction wherein selective etching can be accomplished without need for masking adjoining regions. The present invention has the ability to process different layers of the multilayer device simultaneously. The present invention takes advantage of a unique physical property of the materials to be processed to create localized reactive conditions without the need for additional thermal energy, or the need to externally generate free electrons to create a working plasma. The present invention is able to achieve these goals by selectively providing free electrons from conductive materials using a tunable radiation source whose energy can be adjusted to excite the electrons of one material preferentially to an adjacent material. This recognition enables the present invention to be used in a variety of common semiconductor processing steps with enhanced selectivity, and with fewer process steps, leading to more precise circuit design capability and higher fabrication yields.

SUMMARY OF THE INVENTION

Conductive materials have the ability to emit secondary electrons when excited by photons which possess energy in excess of the unique photoemission threshold of that conductive material. This unique photoemission threshold property is exploited to selectively generate electrons in the present invention by matching the irradiation beam wavelength to the photoemission threshold of the conductive region to be processed. The electrons generated by the irradiation beam are then used to create reactive etching fragments in situ. The etch gas is then selected to yield a volatile reaction product. This series of steps leads to the selective etching of the conductive region, or a photon-transparent layer above the irradiated conductive region. In another embodiment, the etch gas is selected to form a non-volatile reaction product with the conductive region, creating a mask or cap over the conductive region. The variety of processing conditions which can advantageously utilize the present invention are as limitless as the variety of useful device designs.

DETAILED DESCRIPTION OF THE INVENTION

Figure 1A:
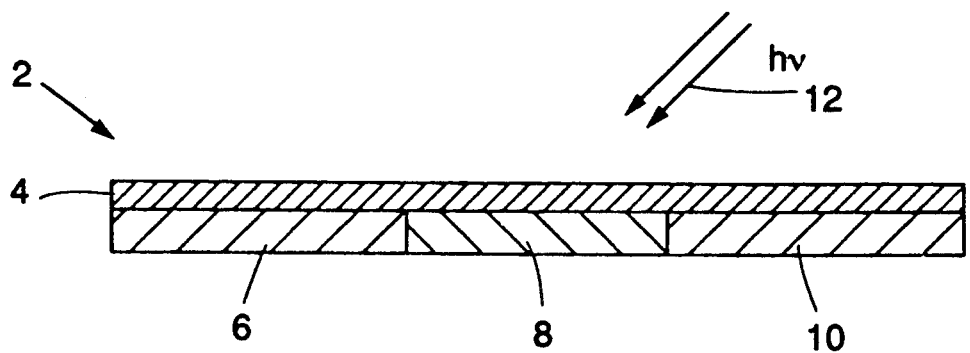
FIG. 1A and 1B are schematic representations of one embodiment of the present invention in which a photon-transparent surface layer is selectively etched from the area above a conductive region while it is retained in areas above adjacent regions.

The idea underlying the present invention is simple: controlled generation of secondary electrons in a region can cause chemistry leading to selective etching of a particular material in the presence of other materials. Selectivity between materials is achieved by the natural variation in photoemission threshold values between different materials. It is even conceivable to use this differentiation between different chemical states of the same material (e.g., doping levels, surface coverage, etc.). Specificity can be easily regulated when it is recognized that the desired etch reaction can be limited in both space and time to the region adjacent the conductor where the electrons are produced by irradiation. This localized phenomena can be advantageously applied to widely different conditions. However, the underlying premise remains the same for each of these divergent conditions.

In order to mitigate any ambiguity which might be caused by the use of terminology which is subject to multiple definitions, we hereby adopt specific definitions. In the present invention, the term "photoemission threshold" is used to describe the minimum threshold energy at which electrons are emitted by a material experiencing photon bombardment. In the case of metal conductive materials, the photoemission threshold corresponds to commonly accepted definitions of the work function. For semiconductor materials, the work function and photoemission threshold are not necessarily the same. For these semiconductor materials, the term photoemission threshold is used in the present invention to refer to the minimum threshold energy at which the material emits an electron.

Recognizing that the present invention has its most immediate and widely understood application to the microelectronics industry, the present invention is described below with reference to semiconductor fabrication examples. This description is not intended to limit the applicable scope of the present invention.

Before describing the application of the present invention in detail, it is first appropriate to describe the processing conditions in which the present invention is to be applied. Starting with the simplest, semiconductor manufacturing involves the use of three classes of materials: conductive materials, semiconductive materials and insulating materials. In conventional integrated circuit design, these different materials are arranged in the two dimensional horizontal plane, as well as the vertical z-axis, to obtain multilayered integrated circuit devices with specific electron pathways. Presently, these multilayered structures are obtained by processing steps involving the sequential deposition and removal of layers to create the desired electron pathways. The present invention is described below with reference to such multilayered structures and with reference to the need to create the desired electron pathways in all axes.

Another aspect of current integrated circuit fabrication technology which is discussed in the embodiments below is etching. Plasma etching processes are used currently to selectively remove surface layers, or portions of a layer, from multilayered structures. The plasma gas is electrically excited to create free electrons, which in turn create radical etch gas fragments which are selectively reactive with the surface layer to be etched. According to the present invention, the etch gas is selected from the group consisting of halogenated hydrocarbon gases, the vapors of halogenated hydrocarbon liquids, and halogenated sulfur compounds. Among the common etch gases in use in the semiconductor industry are carbon tetrachloride, carbon-fluoride based gases and sulfur fluoride. In the present invention, these same etch gases are used, but without gross excitation from an external source to generate the reactive fragments. Instead, reactive etch gas fragments are created locally as described below.

The radiation source most useful with the present invention offers the light intensity (1-100 mJ/cm$^2$) necessary to achieve reasonable etch rates. In certain preferred embodiment described below (wavelengths of 400-150 nm), double dye lasers driven by pulsed excimer lasers are used. Pulsed excimer lasers can be used alone, but they are currently available in fixed wavelengths such as 157 nm, 193 nm, 222 nm, 248 nm, 308 nm and 351 nm.

Lasers are not the only source of acceptable radiation. Broad band ultraviolet light (from a Xenon lamp) shown through a monochromator may be used, but is much slower than a laser source.

Figure 1B:
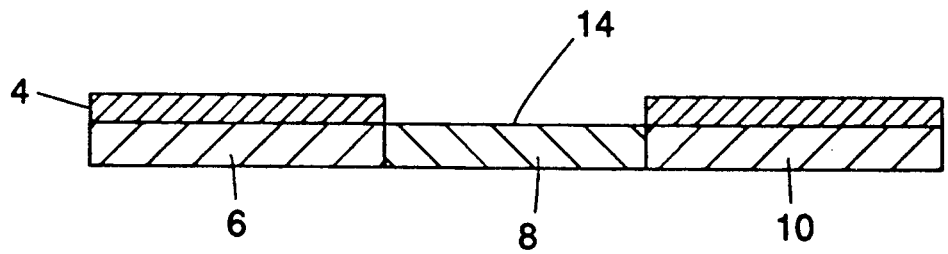

Referring now to the first embodiment of the present invention shown in FIGS. 1A and 1B, a substrate 2 is provided. Substrate device 2 is comprised of a surface layer 4 which is photon-transparent. Examples of such a surface layer is a clear polymer film or an epoxy glass layer. Below surface layer 4 are three substrate regions: first adjacent substrate region 6, conductive region 8 and second adjacent substrate region 10. For purposes of this embodiment, region 6 and region 10 can be insulating layers or they can be conductive layers. They can be the same material or different material. It is only important that both regions 6 and 10 have a photoemission threshold value which is in excess of the photoemission threshold of the conductive region 8.

According to this first embodiment, it is desired to selectively etch the surface layer 4 in the area above conductive region 8. This is accomplished by selecting a radiation wavelength for the impinging radiation beam 12 which provides photons whose energy exceeds the photoemission threshold ("PET") of conductive region 8. In order to prevent the etching of the surface layer 4 above regions 6 and 10, the radiation wavelength must further be selected so as not to exceed the photoemission threshold of the materials which comprise regions 6 and 10. In mathematical terms, PET-8 < BEAM ENERGY < PET6, PET10.

Etching is achieved by the use of an etch gas which is introduced into the reaction chamber containing the substrate device 2 before the beam is applied to irradiate the conductive region 8. The etch gas, selected from plasma etch gases carbon tetrachloride, carbon fluoride based gases and sulfur fluoride, is adsorbed onto the surface of the surface layer 4. The etch gas pressure in the reaction chamber has to be high enough to have enough gas on the surface at any given moment for a reaction to take place. Although this is dependent on the gas, a range of $1 \times 10^{-5}$ to 1000 torr should be adequate. Once the irradiation beam 12 is applied to the substrate 2, conductive region 8 will be stimulated to emit electrons which react with the adsorbed etch gas molecules to form reactive fragments. These reactive fragments then react with the surface layer material 4. In the present embodiment involving the etching of this surface layer, an etch gas is chosen which will form volatile reaction products with the surface layer 4 so that the resulting reaction product can be withdrawn from the reaction chamber.

In order to remove the etch reaction products from the reaction chamber, the etch reaction product vapor pressure must exceed the pressure in the chamber. Some of the etch products have very high vapor pressures, e.g., $SiF_4$, and would leave spontaneously. Other etch products have lower vapor pressures and would have to be forced to leave by increasing the substrate temperature.

The result of this processing is shown in FIG. 1B. Etched region 14 is created in the space previously occupied by surface layer 4. Since electrons are not generated in adjacent regions 6 and 10, reactive etch gas fragments are not formed and no etching takes place above these regions. This localized electron generation permits selective etching.

Figure 2A:
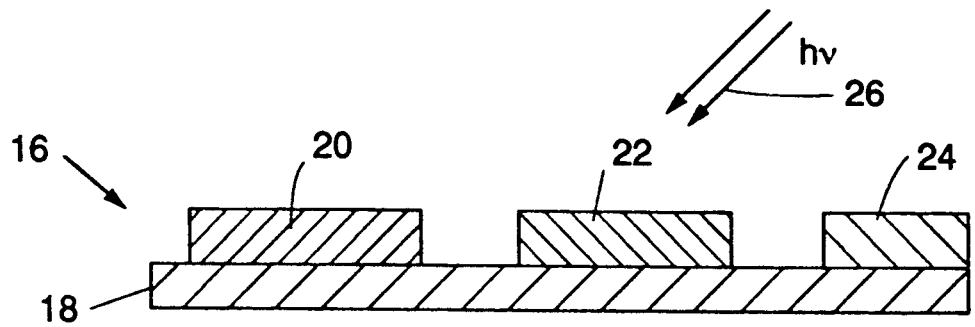
FIG. 2A and 2B are schematic representations of a second embodiment of the present invention in which one conductive region is selectively etched in the presence of two other conductive regions characterized by photoemission threshold values greater than the first conductive region.
Figure 2B:
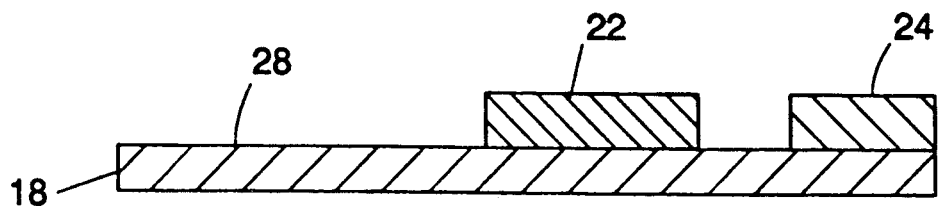

A second embodiment of the present invention is illustrated with reference to FIGS. 2A and 2B. In this embodiment, the object is to selectively etch one conductive region in the unmasked presence of two other conductive regions having photoemission threshold values in excess of the photoemission threshold value which characterizes the region to be etched. Substrate device 16 is comprised of base layer 18, which can be a semiconducting material or an insulating material. Conductive regions, characterized by varying photoemission threshold values, have been deposited on base layer 18. The object here is to selectively etch a first conductive region 20, in the presence of second conductive region 22 and third conductive region 24. The photoemission threshold of first conductive region 20 is lower than the respective photoemission thresholds of both regions 22 and 24. Under these conditions, provided that there is a large enough difference between these photoemission threshold values, first conductive region 20 can be selectively etched in the presence of regions 22 and 24 without having to first mask regions 22 and 24. This is accomplished by selecting an irradiation beam 26 whose wavelength is in excess of the photoemission threshold of first conductive region 20 but whose wavelength is less than the respective photoemission thresholds of regions 22 and 24.

Selective etching takes place in this embodiment through the use of an etch gas which is introduced into the reaction chamber containing substrate device 16. The etch gas molecules are adsorbed on the surfaces of the substrate device 16. Reactive etch gas fragments, however, are only generated at the surface of conductive region 20 because its surface is emitting electrons under stimulus from the irradiation beam 26. Reactive etch gas fragments, once formed, react with the metal in conductive region 20 to create volatile reaction products which are removed from the reaction chamber under vacuum, leaving etched region 28 where conductive region 20 previously existed. This technique would be useful in selectively etching one metal region in the presence of other metal regions.

It is known that fluorine-containing gases react with refractory metal oxides at high temperatures to form volatile metal compounds.

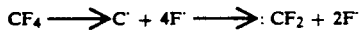

It is also known that fluorine species in the plasma may react with silicon nitride and silicon:

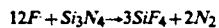

The use of energy-activated carbon tetrafluoride to etch aluminum is disclosed in U.S. Pat. No. 4,182,646 to Zajac.

Figure 3A:
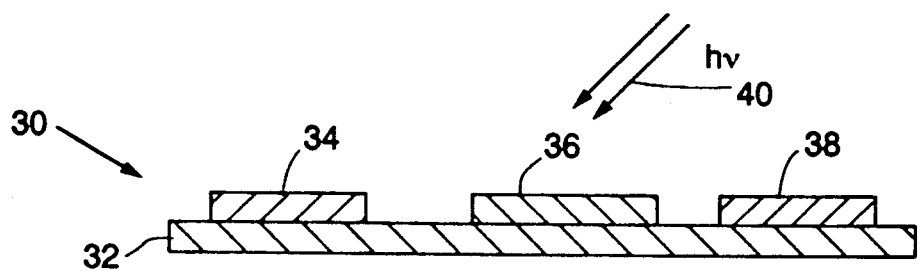
FIGS. 3A, 3B and 3C are schematic representations of a third embodiment of the present invention in which two conductive regions are capped by the use of a non-volatile etch gas product in a first step, leading to the selective etching of an uncapped third conductive region having a photoemission threshold greater than the photoemission thresholds of the two capped regions in a second step.
Figure 3B:
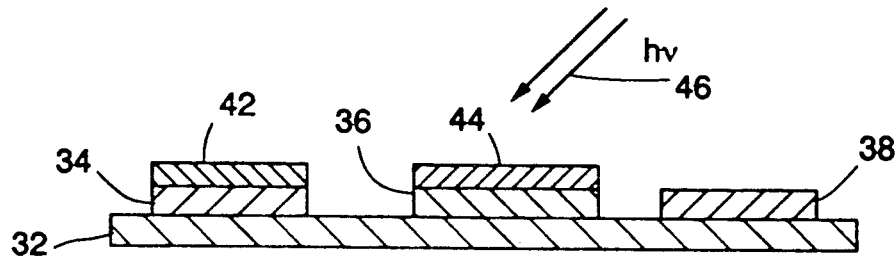
Figure 3C:
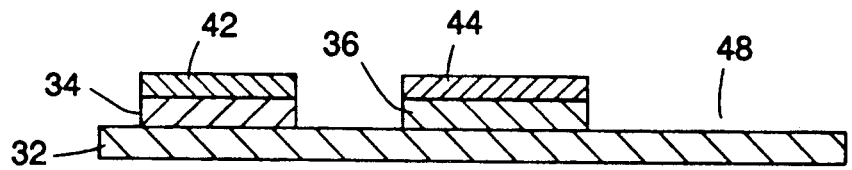

A third embodiment of the present invention is shown in FIGS. 3A, 3B and 3C. The object of the process illustrated in FIG. 3 is to selectively etch a conductive region which has a photoemission threshold in excess of the photoemission threshold of a second conductive region on the same surface. The methodology of the previous embodiment, described with reference to FIG. 2, cannot be used to accomplish this result because a radiation beam with adequate energy to cause electron emissions from the higher photoemission threshold material would necessarily result in the undesired generation of electrons at the conductive region having the lower photoemission threshold. Therefore selective etch under these conditions cannot be accomplished without changing the processing conditions.

Therefore, according to the third embodiment of the present invention, substrate device 30 comprises base layer 32, first conductive region 34, second conductive region 36 and third conductive region 38. Conductive regions 34 and 36 are characterized by lower photoemission threshold values than third conductive region 38 which is the region to be selectively etched while keeping regions 34 and 36 intact. In order to etch region 38 preferentially, regions 34 and 36 are capped in a first step (FIG. 3A). This first processing step involves the use of an irradiation beam 40 to create active electrons on the surface of regions 34 and 36. The wavelength of this first irradiation beam 40 is chosen to fall below the photoemission threshold value of region 38 to be etched. Under these conditions, active electrons are not generated at the surface of region 38.

As has been described with respect to previous embodiments, etch gas is provided to the reaction chamber containing substrate device 30 in this first step and adsorbs onto the surfaces of substrate device 30. In this embodiment, however, etch gas is selected whose reactive fragments form non-volatile reaction products with the surface of conductive regions 34 and 36. Since the reaction products are left on the surface of regions 34 and 36 a cap is created (see layers 42 and 44 in FIG. 3B) on these regions. These caps are preferably opaque to photons, otherwise they might be reactive in the second irradiation step described below.

The etch gas compounds useful in generating non-volatile reaction products are selected from the group consisting of halogenated hydrocarbon gases, the vapors of halogenated hydrocarbon liquids, organometallic compounds of the transition metals and semiconductors (e.g., tetramethyl silane, trimethyl aluminum, tetraethoxy silane, etc.), and inorganic compounds of the transition metals and semiconductors. Non-volatile reaction products are those with low vapor pressure. A good example of this is tetramethyl silane which reacts with free electrons to form silicon carbide on the conductive substrate. This material is non-volatile. Some of the metal halides, e.g., $NiBr_2$, are also non-volatile.

After regions 34 and 36 have been capped, a second irradiation step is performed to selectively etch region 38 to obtain etched region 48, as seen in FIG. 3C. Second irradiation beam 46 is characterized by a wavelength which exceeds the photoemission threshold of region 38. Prior to irradiation, a second etch gas is provided to the reaction chamber containing the substrate device 30. This second etch gas is chosen to generate reactive etch gas fragments which will form volatile reaction products with the material of conductive region 38. In this manner, conductive material may be etched away, and the resulting etch gas products can be easily withdrawn from the reaction chamber by vacuum. During this second step, no further reaction occurs on capping layers 42 and 44, which desirably remain inert during this second irradiation step.

Figure 4A:
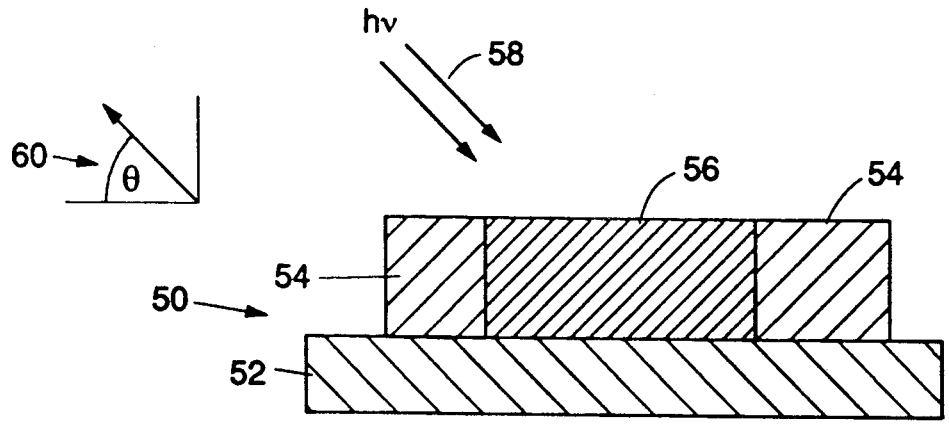
FIGS. 4A and 4B are schematic representations of an embodiment of the present invention in which contoured surfaces are created using the present invention.
Figure 4B:
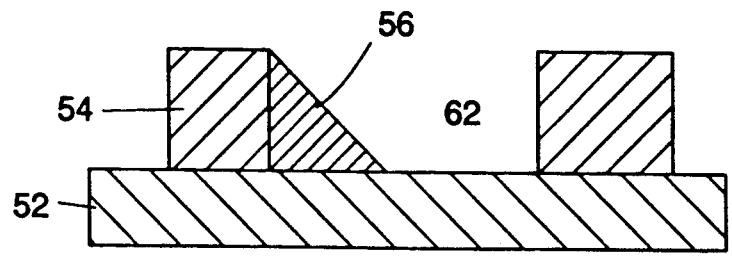

Since the driving force for the selective etching process in all of these embodiments is the electrons released from the surface molecules irradiated by an incident photon beam, it is possible to impinge the irradiation beam on the surface to be etched at varying angles. This angled beam can be manipulated by photon-opaque regions to create shadows, resulting in varied contour surfaces. One such exemplary embodiment is shown in FIGS. 4A and 4B. Substrate device 50 is provided in a reaction chamber for selective, directional non-orthogonal etching. The object is to etch a region to leave a portion behind with a non-orthogonal surface. This configuration may be desired as a base upon which additional materials are to be deposited. Device 50 comprises a base layer 52, first region 54 and second region 56. First region 54 may or may not be comprised of a conductive material. For purposes of describing the present embodiment, the character of region 54 must be limited to those which will permit region 56 to be etched in the unmasked presence of region 54. If region 54 is made of a conductive material, region 54 must be characterized by a photoemission threshold which is greater than region 56. The selective, non-orthogonal etch of region 56, is commenced by the introduction of an etch gas to the reaction chamber. Etch gas is chosen for this process whose reactive fragments will form volatile reaction products with material comprising region 56. Once introduced into the reaction chamber, etch gas is adsorbed onto all exposed surfaces of device 50.

Next, an irradiation beam is selected whose wavelength exceeds the photoemission threshold of region 56 while not exceeding the photoemission threshold of region 54. To achieve non-orthogonal etching, the irradiation beam 58 is provided at an incident angle $\theta$ 60. When beam 58 is provided at this angle, the left side of region 54 will begin to cast a shadow on region 56. In this shadowed region, there is no photon stimulation and therefore no surface electrons are emitted to create reactive etch gas fragments. Therefore, in the shadow of region 54, no etching occurs. Ultimately, this leaves a non-orthogonal surface on region 56 and an etched region 62. This angular etching provides a degree of design flexibility which is virtually nonexistent using current fabrication techniques.

In summarizing the embodiments described above, it is possible to list common process steps:
1. Etch gas is adsorbed onto the substrate surface.
2. Irradiation beam impinges upon the surface of the substrate.
3. Electrons emitted from the surface of the photo-excited regions cause the etch gas to break up into reactive fragments on the surface of the region to be etched.
4. The etch gas reactive fragments react with the region to be etched to form volatile reaction species.
5. The volatile species evaporate and are withdrawn from the reaction chamber. (This is most effectively accomplished by heating the substrate device.)

A number of other process limitations must be kept in mind. The etching gas and irradiation process steps are carried out in reaction chambers under vacuum. When volatile reaction products are involved, the pressure must be below the etch product vapor pressure. When selecting an irradiation beam wavelength, it is important to pick a wavelength which will not be directly absorbed by the etch gas molecule. If direct absorption of the beam by the etch gas occurs, the etch gas molecule will dissociate directly into reactive fragments, and selectivity resulting from localized electron/fragment generation will be lost. When carbon tetrachloride is used as an etch gas, a beam wavelength of 281 nanometers is acceptable, but wavelengths lower than approximately 220 nanometers would be directly absorbed by the etch gas leading to universal dissociation into reactive fragments, rather than localized dissociation into fragment caused by surface emitted electrons. It presently appears that useful wavelengths for etching will typically be in the range of 4 to 7 eV, corresponding to a range of 308 to 177 nanometers. Particularly at the lower end of this range, wavelengths outside of this range may be required to account for photoemission threshold variations resulting from etch gas absorbate phenomena.

As noted above, when attempting to selectively etch one conducting region in the presence of a second conducting region, there must be an acceptable difference in the relative photoemission thresholds to permit a reasonable selective etch process. It is clear that quantum efficiency drops rapidly at the photoemission threshold so that a difference in photoemission thresholds of 0.25 eV should be adequate to provide an electron generation rate differential of 100:1 (low threshold material generation rate:high threshold material generation rate.)

The power of the irradiation beam must also be considered in process design. Its power cannot be arbitrarily increased because as the power of the beam goes up, so too surface heating effects. It is our experience that 10 mJ/pulse cm$^2$ does not heat the surface too much. An order of magnitude increase to 100 mJ/pulse cm$^2$ will definitely heat the substrate surface significantly. This heating phenomena may be used to help remove volatile etch gas reaction products with lower vapor pressures.

The following calculations demonstrate the practicability of processes according to the present invention.

Assume carbon tetrachloride (CCl$_4$) as the etch gas. It has an electron attachment cross-section of $5 \times 10^{-16}$ cm$^2$. Also assume that the surface atomic density of the species to be etched is $1 \times 10^{15}$ atoms/cm$^2$.

A 10 mJ/pulse cm$^2$ of radiation having wavelength 275 nm (4.5 eV) with a pulse of 20 nanoseconds and a repetition rate of 100 Hz provides the photons as follows:

$7.23 \times 10^{-16}$ J/photon and $1.38 \times 10^{19}$ photons/pulse cm2 at the surface. Using 100 Hz (pulses per second), provides $1.38 \times 10^{21}$ photons/sec cm$^2$ impinging upon the irradiated surface. Each photon creates approximately $5 \times 10^{-3}$ electrons, thus supplying $6.92 \times 10^{19}$ electrons/sec cm$^2$ leaving the surface above the material to be etched. With the number of emitted electrons, the etch rate based upon electron attachment cross section is calculated:

$$[6.9 \times 10^{19} \text{ e-/sec cm}^2] \times [5 \times 10^{-16} \text{ cm}^2] \times [4 \times 10^{19} \text{ CCl}_4/\text{cm}^2]$$

equals $1.4 \times 10^{19}$ carbon tetrachloride atoms fragmented/sec. Next assume it takes 2 etch gas molecules to remove a single metal atom:
$[7.0 \times 10^{18}$ CCl$_4$/sec$] \times [1 \times 10^{15}$ atoms/monolayer$] = 7000$ monolayers etched/sec.

If each monolayer is approximately 3 Angstroms thick, the etch rate is 21,000 Å/sec or 2.1 µm/sec. This clearly falls within a useful range.

Typical work functions (which for the listed materials is the same as photoemission threshold) values are obtained from the CRC Handbook of Chemistry and Physics (64th Edition CRC Press 1983-84.)
Au=5.4 eV
Si=4.8 eV
W=4.6 eV
Al=4.3 eV
Ti=4.3 eV Based upon the relative photoemission thresholds of p-type doped silicon (4.93 eV) and n-type doped silicon (4.75 eV), it should be possible to selectively etch n-type silicon in the unmasked presence of p-type doped silicon. These work function values are taken from *Physics at Surfaces*, A. Zanguill, Cambridge Press 1988.

A nonexhaustive listing of the conductive materials which may be etched according to the present invention includes any atom which will emit photoelectrons, e.g., tungsten, molybdenum, aluminum, copper, silver, gold, refractory metals and coinage metals. Mercury is not included in this list, but silicon and doped silicon compounds are included.

While the present invention has been described with respect to specific embodiments, it will be recognized by those skilled in the art that the scope of the present invention is broader than the examples described here.

I claim:

1. A process for selectively etching a region on the surface layer of a substrate device which comprises the steps of:
   (a) providing in a chamber a substrate device having a photon-transparent surface layer, a region of which is to be selectively etched away, said substrate device further having a conductive regions below said surface layer and characterized by a photoemission threshold, said conductive region being adjacent to another substrate device region characterized by a photoemission threshold value greater than the photoemission threshold of said conductive region;
   (b) providing an etch gas to said chamber causing said etch gas to adsorb onto the surface layer of said substrate device, said etch gas being selected to enable the dissociation of said etch gas into fragments which react with the substrate device surface layer to form a volatile reaction product;
   (c) impinging a beam of radiation upon said substrate device within said chamber, said beam radiation wavelength being selected to exceed the photoemission threshold of said substrate device conductive region to thereby generate photo-excited electrons which are reactive with the etch gas molecules adsorbed onto the substrate device surface layer above said conductive regions to form reactive etch fragments, said beam radiation wavelength further being selected to be less than the photoemission threshold of said other substrate device region adjacent said conductive region; and,
   (d) removing volatile species formed on the substrate device surface above said conductive region by the reaction of the reactive etch fragments and said substrate device surface layer to thereby selectively expose the conductive region of said substrate device lying underneath said surface layer while said other substrate device region adjacent said conducive region remains covered by said photon-transparent surface layer.

2. The process of claim 1 wherein said conductive region is a conductor selected from the group consisting of transition metals, mixtures of transition metals, semiconductor materials and semiconductor materials doped with other elements.

3. The process of claim 1 wherein said etch gas is selected from the group consisting of halogenated hydrocarbon gases, the vapors of halogenated hydrocarbon liquids, and halogenated sulfur compounds.

4. A process for selectively etching a conductive region on the surface of a substrate device which comprises the steps of: (a) providing in a chamber a substrate device having a plurality of surface conductive regions, each of said conductive regions characterized by a photoemission threshold;
   (b) providing an etch gas to said chamber, causing said etch gas to adsorb onto the surfaces of said substrate device including said conductive regions, said etch gas being selected to enable the dissociation of said etch gas into fragments which react with the material comprising the conductive regions to form a volatile reaction product;
   (c) impinging a beam of radiation upon said substrate within said chamber, said beam radiation wavelength being selected to exceed the photoemission threshold of said conductive region to be selectively etched to thereby generate photo-excited electrons from said conductive region which are reactive with the etch gas molecules adsorbed onto the conductive region surfaces to form reactive etch fragments, said beam radiation wavelength further being selected to be less than the photoemission threshold of the conductive regions which are not to be etched; and,
   (d) removing volatile species formed on the conductive region surface by the reaction of the etch fragments and said conductive region to selectively etch a conductive region while leaving other conductive regions on said substrate device intact.

5. The process of claim 4 wherein said conductive region is a conductor selected from the group consisting of transition metals, mixtures of transition metals, semiconductor materials and semiconductor materials doped with other elements.

6. The process of claim 4 wherein said etch gas is selected from the group consisting of carbon tetrachloride, carbon-fluoride based gases and sulfur fluoride.

7. A process for selectively etching a substrate device surface conductive region characterized by a greater photoemission threshold than other conductive regions on said substrate device surface, said process comprising the steps of:
   (a) providing in a chamber a substrate device upon whose surface are disposed at least two conductive regions characterized by different photoemission thresholds;
   (b) capping a conductive region whose photoemission threshold is less than the photoemission threshold of a conductive region to be selectively etched from said substrate device surface, said capping being accomplished by: (i) selecting a first etch gas which, upon contact with free electrons, dissociates into reactive etch fragments which will form nonvolatile reaction products with the material comprising the conductive region to be capped; (ii) introducing said first etch gas into said chamber where it is adsorbed onto the surface of said substrate device, including the conductive region to be capped; (iii) selecting a first radiation source whose radiation wavelength is above the photoemission threshold of said conductive region to be capped and whose wavelength is also less than the photoemission threshold of the conductive region to be selectively etched; (iv) impinging said radiation from said first source upon said substrate device to generate free electrons only at the surface of the conductive region to be capped, said free electrons reacting with said adsorbed first etch gas molecules to form reactive fragments which react with said conductive region surface to form nonvolatile reaction products which build up on the surface of said conductive region to be capped, said nonvolatile reaction products forming a thin film on said surface opaque to photons; and (v) removing said first etch gas from said chamber;

(d) providing a second etch gas to said chamber which absorbs onto the surface of said substrate device, including the conductive region to be selectively etched, said second etch gas selected such that upon contact with free electrons, said second etch gas dissociates into reactive etch gas fragments which react with the uncapped substrate conductive region to form a volatile reaction product;

(e) impinging a second beam of photon radiation upon said substrate device within said second chamber, said beam radiation wavelength selected to exceed the photoemission threshold of said uncapped substrate conductive region which is to be selectively etched to thereby generate photo-excited electrons which are reactive with the second etch gas molecules adsorbed onto the surface of said conductive regions to be selectively etched; and (f) removing volatile species formed on said conductive region surfaces to thereby selectively etch the desired conductive region while the previously capped region is left intact.

8. The process of claim 7 wherein said conductive region is a conductor selected from the group consisting of transition metals, mixtures of transition metals, semiconductor materials and semiconductor materials doped with other elements.

9. The process of claim 7 wherein said first etch gas is selected from the group consisting of halogenated hydrocarbon gases, the vapors of halogenated hydrocarbon liquids, organometallic compounds of the transition metals and semi-conductors, and inorganic compounds of the transition metals and semiconductors.

10. The process of claim 7 wherein said second etch gas is selected from the group consisting of halogenated hydrocarbon gases, the vapors of halogenated hydrocarbon liquids, and halogenated sulfur compounds.

11. A process for selectively etching a conductive region on the surface layer of a substrate device to create a non-orthogonal surface which comprises the steps of:

(a) providing in a chamber a substrate device having a surface conductive region characterized by a photoemission threshold, said conductive region to be etched bounded on at least one side by an adjacent region which is inert to said beam radiation;

(b) providing an etch gas to said chamber, causing said etch gas to adsorb onto the surfaces of said substrate device including said conductive region, said etch gas selected such that upon contact with free electrons, said etch gas dissociates into reactive etch gas fragments which react with the material comprising said conductive region to form a volatile reaction product;

(c) impinging a radiation beam upon said substrate device at a non-orthogonal incidence angle such that said adjacent region forms a shadow on the conductive region to be etched, said beam radiation wavelength being selected to exceed the photoemission threshold of said conductive region to thereby generate photo-excited electrons at the surface of said conductive region which are reactive with the etch gas molecules adsorbed onto the surface of said conductive region to form reactive etch gas fragments, said beam radiation wavelength further being selected to be less than the photoemission threshold of said adjacent region; and (d) removing volatile species formed on the surface of said conductive region by the reaction of the etch gas fragments and said conductive region to thereby selectively etch the conductive region to obtain a non-orthogonal conductive region surface.

12. The process of claim 11 wherein said conductive region is a conductor selected from the group consisting of transition metals, mixtures of transition metals, semiconductor materials and semiconductor materials doped with other conductive elements.

13. The process of claim 11 wherein said etch gas is selected from the group consisting of carbon halogenated hydrocarbon gases, the vapors of halogenated hydrocarbon liquids, and halogenated sulfur compounds.

* * * * *